United States Patent [19]

Kagdis, deceased

[11] Patent Number: 4,464,785
[45] Date of Patent: Aug. 7, 1984

[54] LOUDSPEAKER SYSTEM

[75] Inventor: William A. Kagdis, deceased, late of Baltimore, Md., by Claude F. McKenzie, executor

[73] Assignee: Charles N. K. Cluxton, Baltimore, Md.

[21] Appl. No.: 482,967

[22] Filed: Apr. 8, 1983

[51] Int. Cl.³ .............................................. H04R 3/00
[52] U.S. Cl. ................................... 381/117; 381/116; 381/89; 179/115.5 DV
[58] Field of Search ............. 179/115.5 DV, 115.5 R; 381/116, 117, 120, 102, 109, 107, 89, 111; 307/552; 330/278, 295, 127, 136

[56] References Cited

U.S. PATENT DOCUMENTS 2,926,221 2/1960 Kagdis ........................ 179/115.5 R
3,679,833 7/1972 Inoue ......................... 179/115.5 VC
3,686,446 8/1972 Manger .................... 179/115.5 R X
4,360,707 11/1982 Joseph et al. ........ 179/115.5 DV X Primary Examiner—A. D. Pellinen
Assistant Examiner—James L. Dwyer
Attorney, Agent, or Firm—Leonard Bloom

[57] ABSTRACT

A loudspeaker system includes at least one electromagnetic loudspeaker assembly having a single vibratory coil form to which a vibratory diaphragm is attached. Two or more voice coils are wound on the vibratory coil form, each operating within a magnetic field. Electronic circuitry includes a signal conditioning network and a pair of amplifiers, one amplifier for each of the voice coils. The signal conditioning network, possibly preceded by a filter, is arranged to feed the respective amplifiers, the latter being coupled to their respective ones of the voice coils. D.C. currents provide forces in each of the voice coils, such that these forces are caused to oppose one another. The signal currents in the voice coils are such that the difference in the forces developed by the voice coils produce a vibratory motion of the voice coil form and the diaphragm attached thereto. A power supply is provided. A variable impedance circuit is connected between the power supply and the voice coils for adjusting the D.C. current supplied to the voice coils, whereby the D.C. current will vary either automatically with peaks of the input signal level or with the setting of a volume control. The automatically varying level is set by a forward fed control signal developed by rectifying the input signal and integrating it to produce a slowly varying D.C. level. In the second case, the control signal is developed by a potentiometer which is mechanically ganged to a volume-control potentiometer.

11 Claims, 12 Drawing Figures

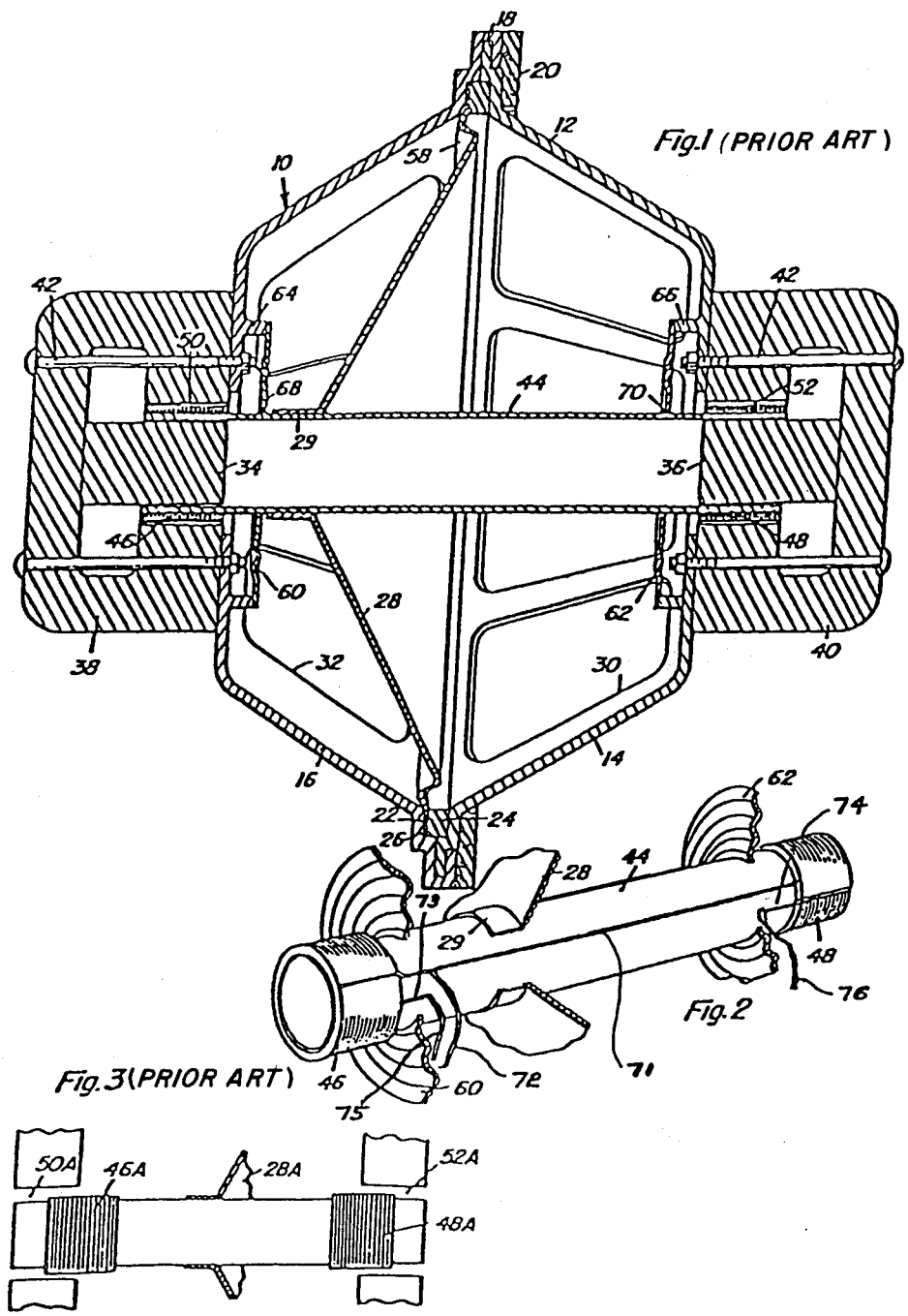

LOUDSPEAKER SYSTEM

BACKGROUND OF THE INVENTION

This invention relates to a loudspeaker system which includes dynamic speakers, and more particularly, to a loudspeaker system which includes at least two movable voice coils mounted on a single rigid coil form in operative association with a pair of amplifiers.

A loudspeaker system of this general type has been disclosed in U.S. Pat. No. 2,926,221 issued to W. A. Kagdis on Feb. 23, 1960 and entitled "Loudspeaker Construction". In this '221 patent, a pair of spaced apart magnetic circuits is each provided with a respective air gap. A rigid coil form extends between the air gaps, and the respective ends of the coil form extend into the respective gaps and have respective voice coils thereon.

Similar loudspeakers are disclosed in U.S. Pat. No. 3,686,446 to J. W. Manger entitled "Push-Pull Moving Coil Loudspeaker having Electromagnetic Centering Means" and in U.S. Pat. No. 3,055,991 to R. Guss entitled "Loudspeaker", the former also disclosing a number of prior art circuits used to drive the voice coils. In particular, Manger, supra, discloses a number of circuits suitable for driving the pair of voice coils in push-pull. In particular, a pair of transistors of like conductivity type or a pair of complementary transistors are provided to effect the driving of the pair of voice coils in push-pull. In each case, it appears that large D.C. currents must flow in the transistors and in the voice coils, without regard to signal levels, at all times in order to assure that clipping and distortion will not result.

Moreover, circuits which require relatively large D.C. current flow at all times through the voice coils and the transistors are inefficient. Furthermore, the voice coils and particularly the transistors must either have relatively high heat dissipating capacity or be provided with large heat sinks which are both bulky and expensive. In some instances, other circuitry which removes the D.C. component from the voice coils by feeding the voice coils via capacitor or transformer circuits, can be provided. This has a disadvantage that additional circuit components are required and does not solve the problem of heat generation in the transistors themselves and its associated inefficiency.

One possible known solution to the problem is to operate a transistor amplifier as class B amplifiers, in effect allowing only one of the transistors of a pair to conduct at any given time. One of the problems of operating transistors in an audio circuit as Class B amplifiers is that a considerable amount of distortion is likely to be produced. It is much better, if possible, to operate audio amplifiers as Class A amplifiers which produce less distortion. It is also known that when complementary transistors are utilized to effect a push-pull operation, that the turning on and off of these transistors produces cross-over distortion.

SUMMARY OF THE INVENTION

An object of the present invention is to provide a loudspeaker system which facilitates the use of Class A amplifiers to drive a pair of voice coils mounted on a single coil form without utilizing capacitor or transformer coupling circuitry to remove the D.C. current component.

Another object of the present invention is to provide a loudspeaker system in which a pair of voice coils are driven directly without the need of expensive circuitry which includes transformers and/or capacitors and yet does not introduce undesirable distortion.

A further object of the invention is to provide a loudspeaker system which includes Class A amplifiers which drive a pair of voice coils mounted on a single coil form which does not require the use of complementary transistors, thus avoiding the production of crossover distortion.

An additional object of the present invention is to provide a loudspeaker system which effects the driving of a pair of voice coils mounted on a single coil form directly by Class A amplifiers, which, nevertheless, do not carry high D.C. currents at all times, circuitry being provided to effect a change in the D.C. current levels in relation to the magnitude of the signals which are to be amplified, thereby preventing clipping.

The foregoing objects, as well as others which are to become clear from the text below, are achieved by providing a loudspeaker system which includes, in combination, at least one electromagnetic loudspeaker assembly which involves a single vibratory coil form to which a vibratory diaphragm is attached. Two or more voice coils are wound on the vibratory coil form, each operating within a magnetic field. A pair of amplifiers, operated in Class A, is provided for driving the respective voice coils. The voice coils are arranged so that they produce opposing forces in response to D.C. current flowing through them and are operatively arranged to receive their respective driving currents, that is A.C. current components, so that the voice coils act in unison and effect a cooperative driving of the diaphragm. A variable impedence device, such as a transistor, is positioned between the power supply and the amplifiers and their respective series connected associated voice coils so that the supply current can be regulated, preferably by a control circuit which produces a control signal which corresponds to the peak amplitude of the signals sought to be fed to the Class A amplifiers for amplification.

These and other objects of the present invention will become apparent from a reading of the following specification taken in conjunction with the enclosed drawings.

BRIEF DESCRIPTION OF THE DRAWINGS

FIG. 1 is a longitudinal, sectional view of the dynamic speaker which has a single diaphragm and is driven by two voice coils mounted on a rigid coil form and which may be driven by a pair of Class A amplifiers associated with a variable D.C. current supply in accordance with the present invention.

FIG. 2 is a perspective view of two voice coils showing their rigid, coil form which rigidly mounts them in spaced part alignment.

FIG. 3 is a schematic representation showing the two voice coils in relation to their respective associated magnets.

DETAILED DESCRIPTION OF THE PREFERRED EMBODIMENTS

Figure 4:
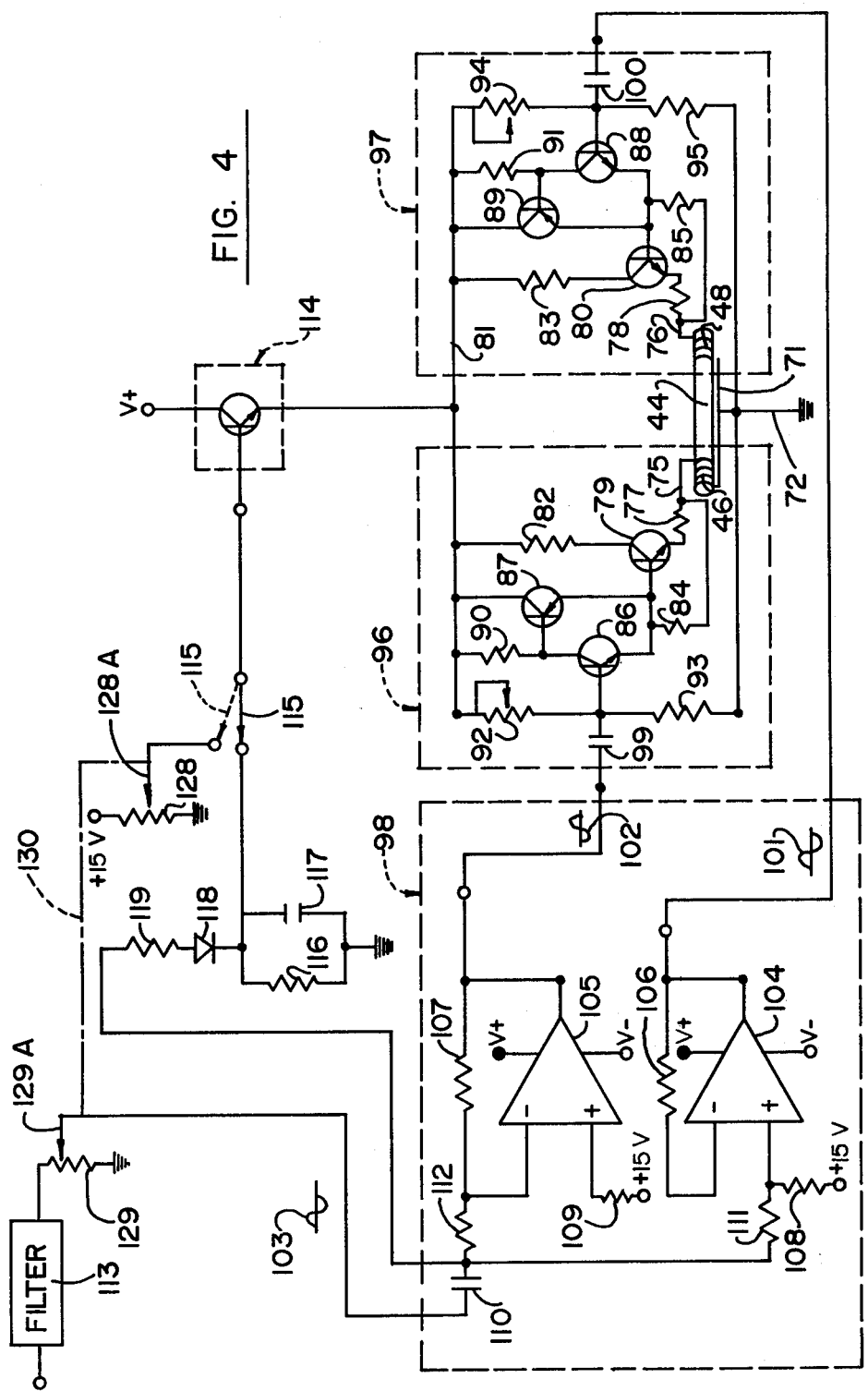
FIG. 4 is a simplified schematic diagram of a loudspeaker system in accordance with a preferred embodiment of the present invention.

In FIGS. 1-3 of the accompanying drawings there is a loudspeaker 10 which is constructed in accordance with the principles disclosed in the aforesaid Kagdis '221 patent, and which can be used in practicing the present invention, FIG. 2 being modified as hereinbelow described. The loudspeaker 10 has a frame 12 made of two frame sections 14 and 16 connected together at their corresponding edges by interlocked flanges 18. A cushion ring 20 is adhered to one surface of the flanges 18 and is used in the ordinary way. Annular pocket 22 is at the inner circumference of the interlocked flanges 18 and has a pliant ring 24 in it. The rim 26 of diaphragm 28 is attached, as by gluing, to ring 24 and a surface of pocket 22. The diaphragm 28 is in the form of a cone although other configurations may be used. Frame 12 has the shape of two conventional, permanent magnet speaker baskets or frames which are bolted or otherwise connected together at their flanges. Openings 30 and 32 in the frame sections 14 and 16 enable the diaphragm to function as such without significant aerodynamic resistance.

Permanent magnets 34 and 36 plus flux return structures 38 and 40 for each permanent magnet, are mounted in axial spaced relationship to one another and on the sections of frame 12. Numerous techniques for mounting the magnets and their return structure are known, one being rising bolts 42 and nuts which fasten the magnets and flux return structures in place on the opposing sections of frame 12.

A single coil form 44 is disposed in the frame 12 and has hollow ends within which magnets 34 and 36 are located. Two voice coils 46 and 48 are positioned on the respective ends of coil form 44 and are immersed in respective high density flux across gaps 50 and 52 formed respectively between the magnets 34, 36 and their respective flux return structures 38, 40. Diaphragm neck 29 is fitted over the coil form 44 intermediate between the voice coils 46 and 48 and is glued in place. As illustrated in FIG. 1 coil form 44 is capable of oscillations whose excursion will be limited by the size and mechanical characteristics of a number of the parts. The excursions are produced by two voice coils, two permanent magnets and two flux return structures. The only reason that permanent magnets are selected for illustration in preference to electromagnets is that permanent magnets are presently more popular in dynamic speaker construction. The principles of the invention nevertheless are equally applicable with electromagnetically energized speakers.

One end of each of the voice coils 46 and 48 are operatively connected together by an electrical conductor 71 adhered to the surface of the hollow coil form 44.

A lead 72 extends from conductor 71 to provide a conductive connection to a driving circuitry such as the one shown in FIG. 4. Other ends of the respective voice coils 46 and 48 are connected to respective electrical conductors 73 and 74, which are also adhered to the surface of the coil form 44. Respective leads 75 and 76 extend respectively from the conductors 73 and 74, providing connections to driving circuitry as shown in FIG. 4. In the sense that the diaphragm is oscillated by the movement of a voice coil in a magnetic field, the speaker shown in FIGS. 1-3 operates the same as any other dynamic speaker. However, by selection of polarity of voice coils 46 and 48 and the field produced at the gaps 50 and 52, the present invention places the diaphragm in mechanical push-pull in response to the application of a signal voltage to the voice coils.

One of the characteristics of the speaker illustrated in FIG. 1 is the extreme flexibility with which the rim compliance 58 of diaphragm 28 can be constructed. The push-pull diaphragm motor relieves the rim compliance 58 of these functions making it possible to further increase the flexibility of the rim compliance or even, omit the rim compliance completely. The omission of the rim compliance in speakers capable of reproducing reasonably undistorted low frequencies is achieved by the structures illustrated in FIG. 1-4. The mechanical coil positioning members consist of a pair of spiders 60 and 62 which may be of the rigid or flexible type. The flexible type is illustrated and is shown as being attached to frame sections 14 and 16 and to which the periphery of the spiders 60 and 62 are secured, as by gluing. Apertures 68 and 70 are provided in the spiders 60 and 62 and have the coil form 44 passed through them. The spiders are located between the voice coils 46 and 48 and on opposite sides of neck 29 of diaphragm 28.

The design of the coil forms can vary from those in FIG. 1. Coil forms 46a and 48a (FIG. 3) are partially immersed in the high density flux across gaps 50A and 52A. Extended coils 46B and 48B could be used on coil form 44B and they would always have the same area immersed in the flux across gaps 50B and 52B during excursions of the coil form 44B. These variants also prevail for all other embodiments of loudspeakers which can be used in the present invention which fall within its comprehension.

A suitable circuit for driving the loudspeaker of type shown in FIGS. 1-3 can be seen in FIG. 4. A rigid, coil form 44 shown in FIG. 4, diagrammatically corresponds to the coil form 44 illustrated in FIGS. 1-3. The pair of voice coils 46, 48 which are illustrated in FIGS. 1-3 are shown diagrammatically in FIG. 4 as being wound on opposite ends of the rigid, coil form 44. One end of the voice coils 46, 48 are connected together by conductor 71 which is connected to reference ground by lead 72. The other ends of the voice coils 46, 48 are connected electrically, via respective conductors 73, 74 (not visible in FIG. 4, see FIG. 2) and respective leads 75, 76 in series with respective resistors 77, 78 to the emitters of respective NPN transistors 79, 80 which have their respective collectors connected to a current buss 81 via respective resistors 82, 83 which are connected respectively in series with the respective collectors of the transistors 79, 80. The respective bases of the transistors 79, 80 are connected via respective resistors 84, 85 to the ungrounded ends of the respective voice coils 46, 48.

The bases of the respective transistors 79, 80 are also connected to the emitters of respective pairs of complementary transistors 86, 87 and 88, 89 connected in a classic Darlington arrangement; the collectors of the respective transistors 86, 88 are connected to the bases of the respective transistors 87, 89, which have their bases connected to the current buss 81 via respective resistors 90, 91. Base biasing for the respective transistors 86, 88 is provided by respective voltage dividers consisting respectively of a rheostat 92 and fixed resistor 93 connected in series between the current buss 81 and ground, and a rheostat 94 connected in series with a fixed resistor 95 connected between the current buss 81 and ground. The respective rheostats 92, 94 are utilized to balance the two Class A amplifiers constituted by the circuit components shown in FIG. 4 and hereinabove discussed, these amplifiers being respectively illustrated generally as blocks 96, 97, shown in broken lines. The bases of the respective transistors 86, 88 are connected to receive respective outputs of a signal conditioning network or circuit 98 (also shown in broken lines) by respective coupling capacitors 99, 100, which are parts of the respective Class A amplifiers 96, 97. The signal conditioning circuit 98, which is of known conventional construction, provides two output signals. These output signals correspond to the input signal received by the conditioning circuit 98, except that the two outputs are of opposite phase (as illustrated generally by the waveforms 101, 102) which can be compared with the waveform 103 of the input audio signal. The signal conditioning network 98 consists of respective operational amplifiers 104, 105 having their outputs coupled to their respective inverting inputs via respective resistors 106, 107, the respective noninverting inputs being connected to a point of positive 15 volt potential via respective resistors 108, 109. The noninverting inputs of the respective operational amplifiers 104, 105 are connected to a coupling capacitor 110, via series connected resistors 111, 112, respectively.

In the event the speaker in which the voice coils 46, 48 is a tweeter, a high-pass filter 113, which passes only signals having a frequency over about 1,000 Hertz is provided as a possible circuit component through which the input audio signal 103 is fed to the signal conditioning network 98 via its coupling capacitor 110. It is understood that the high-pass filter 113 is optional; were the speaker involved a mid-range speaker, the filter 113 would be constituted as a band-pass filter which passes mid-frequency bands or one which rejects all frequencies below about 50 or 100 Hertz, depending on the design of the mid-range speaker. In the event the speaker is a woofer or a speaker which is to reproduce all audio frequencies, then no filter is required. In these cases, the input audio signal would be fed to the signal conditioning network 98 directly. While the filter 113 is illustrated as a passive filter, it is to be appreciated that the filter could be an active element filter, if desired. In this particular case, the active element could be formed of a third operational amplifier, similar to the operational amplifiers 104, 105 and in fact could consist of one-fourth of a quad of amplifiers available as an integrated circuit from Motorola under number MMC 3301P, the amplifiers 104, 105 being respective other quarters of the quad of amplifiers available on the aforementioned integrated circuit chip.

Figure 5A:
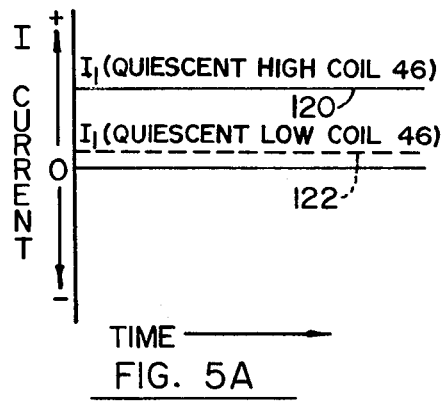
FIG. 5a and FIG. 5B are, respectively, current vs. time graphs of respective quiescent D.C. currents in the respective voice coils of an exemplary embodiment of a loudspeaker system in accordance with the present invention.
Figure 5B:
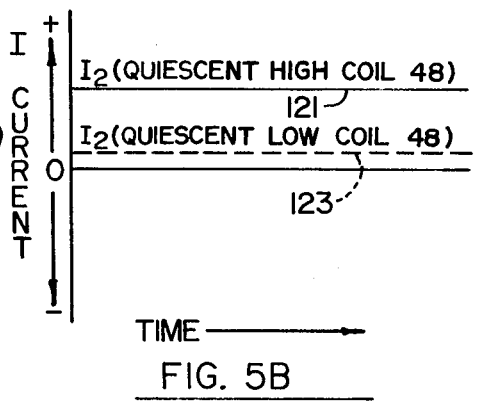
Figure 6A:
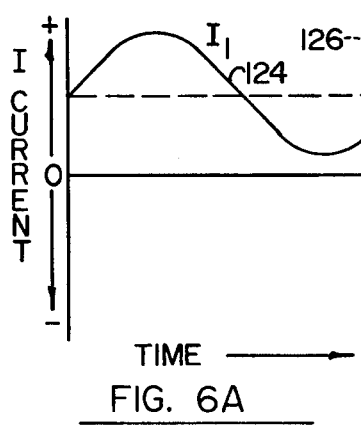
FIG. 6A and FIG. 6B are, respectively, current vs. time diagrams illustrating the dynamic amplifier outputs, in an exemplary embodiment of the present invention, showing the A.C. currents superimposed on the D.C. currents in the respective voice coils under signal input conditions, the levels of the respective D.C. currents having been increased in accordance with the teachings of the present invention.
Figure 6B:
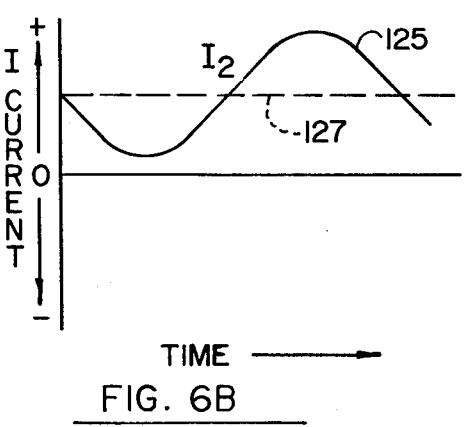

In order to reduce the need for supplying relatively high D.C. currents to the respective power amplifying transistors 79, 80 from the positive terminal of a power supply, a variable impedance circuit shown generally by the broken lines in block 114 may be provided. As illustrated, the variable impedance circuit 114 comprises a transistor having its emitter connected to the current buss 81, its collector connected to a point of positive voltage V+, and its base connected via a single-pole double-throw switch 115 to a long time-constant circuit consisting of, as shown, a large resistor 116 connected in parallel with an integrating capacitor 117, each of which have one end connected to a point of reference ground. The other end of the parallel-connected resistor 116 and capacitor 117 are connected to the cathode of a rectifying diode 118 which has its plate connected, via an isolating resistor 119, to a plate of the coupling capacitor 110. The long time-constant circuit comprising the resistor 116 and the capacitor 117 receives the signal rectified by the diode 118, a positive control signal thereby being produced which is fed (via switch 115) to the base of the transistor constituting the variable impedance circuit 114. As the magnitude, that is, as the peak levels of the input audio signals fed to the signal conditioning circuit 98 increases or decreases, the D.C. signal available to the base of the transistor constituting the variable impedance circuit 114 is respectively increased and decreased, varying as the level changes. The impedance of the variable impedance circuit 114 correspondingly is respectively decreased and increased, varying inversely with the integrated peak signal levels. This causes the level of the D.C. current flowing through the respective transistors 79, 80 and their associated series-connected voice coils 46, 48 respectively, to change in consort with the peak signal levels, raising and lowering the D.C. level therein so that the respective D.C. current levels in the respective voice coils 46, 48 are increased upwardly as illustrated by the solid lines 120 (quiescent, high signal) and 121 (quiescent, high signal) as shown respectively in FIG. 5A and FIG. 5B from the virtually cut-off D.C. current levels shown graphically as dashed lines 122 (quiescent, no or low signal) and 123 (quiescent, no or low signal). This assures that the signals are not clipped, the resulting A.C. current signals being shown respectively for illustrative purposes as a sine waves 124, 125 in FIG. 6A and FIG. 6B, respectively, with the D.C. levels being shown as respective dashed lines 126, 127. Were no A.C. current to be superimposed, the respective quiescent levels of D.C. current would decrease and could in fact approach zero, thereby making the circuit more efficient and preventing overheating of the transistors or avoiding the necessity for using relatively-large capacity heat sinks with the transistors.

As illustrated in FIG. 4, the preferred embodiment of the circuit includes the single-pole, double-throw switch 115 connected in circuit between the long time-constant circuit 116, 117 and the base of the transistor constituting the variable impedance 114. The switch 115 has two manually-selectable positions, the first position being shown by the continuous line (connecting the variable impedance circuit 114 to the long time-constant circuit 116, 117) and the second or alternate position being shown by the broken line on the switch in FIG. 4. In this alternate position of the switch 115, the base of the transistor constituting the variable impedance 114 is connected to the wiper 128A of a potentiometer 128 which is connected between reference ground and a point of positive 15 volts. With the switch 115 connected to the wiper of the potentiometer 128 (instead of to the long time-constant circuit 116, 117) the operating level so far as the D.C. current is concerned is set by the user. The wiper of the potentiometer 128 is ganged mechanically to the wiper of a volume control potentiometer 129, as shown diagrammatically by the dashed-dot line 130. When switch 115 is connected to receive the output from the ganged wiper 128A of the potentiometer 128, the D.C. current levels in the voice coils 46, 48 are set in consort with the signal input level to the signal conditioning circuit 98 as determined by the volume control potentiometer 129.

Figures 7A, 7B, 7C, 7D:
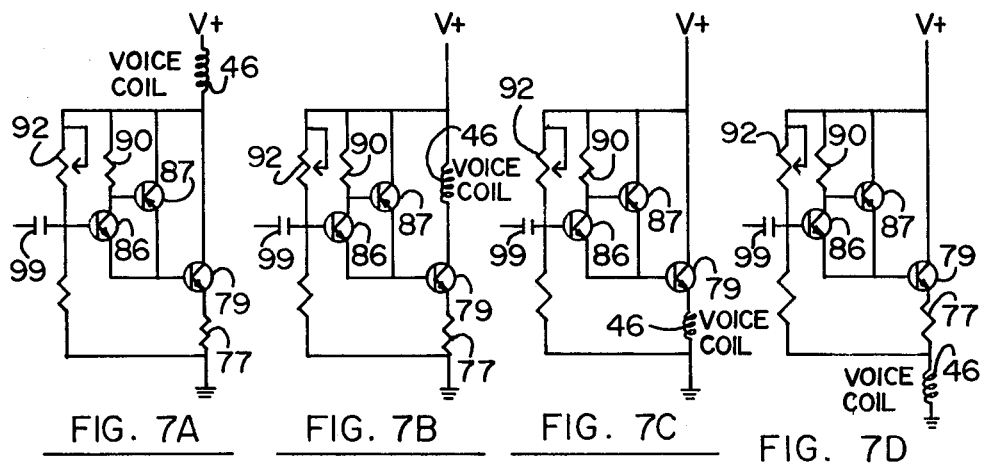
FIGS. 7A-7D are respective illustrations of Class A amplifiers showing alternative placements of the voice coil in relation to the output transistor of one amplifier and the variable impedance device and power supply in accordance with some alternative embodiments of a Class A amplifier associated with the voice coils which may be used in possible alternative constructions.

While the circuit of FIG. 4 is a preferred circuit, the ends of respective voice coils 46, 48 being shown connected to a point of reference ground with the other end of these respective coils being connected to ends of pairs of respective resistors 77, 84 and 78, 85, it is to be appreciated that the respective Class A amplifiers, constituted by the power transistors 79 and 80 could be constructed so that the respective voice coils 46, 48 would be present at a different point in the respective circuits and still receive the D.C. and A.C. components of current flowing through the respective resistors 77, 78. A few alternative positions for the voice coil 46 (for example) of the amplifier 96 are shown in the respective circuits in FIGS. 7A–7D. In each of these FIGS. 7A–7D, the voice coil 46 is shown connected at respective (somewhat different) points in the circuit and yet at points where both the D.C. and A.C. currents flow through the voice coil 46 and its associated transistor 79. It is understood, of course, that the voice coil 46 could be similarly placed in a circuit similar to those shown in each of FIGS. 7A–7D. However, the arrangement of FIGS. 4 and 7D is preferred in which the D.C. ground can be at a point different than A.C. ground, making it easy to connect a number of amplifiers in parallel to the same voice coils.

To place the circuit of FIG. 4 in operation, with the single-pole, double-throw switch 115 in the position illustrated, the power is turned on. Audio signals from any source, such as a radio, preamplifier, microphone or recording reproducing system, are fed, via the filter 113 (if present) to the signal conditioning circuit 98, via the volume or level control potentiometer 129 and the coupling capacitor 110. The signal conditioning circuit 98 in effect amplifies the incoming audio signal 103, providing two amplified output signals 101, 102, respectively, which are identical except that they are 180° out of phase with one another.

The two signals 101, 102 from the signal conditioning circuit 98 are fed respectively to the inputs of the Class A amplifiers 96, 97 via the respective coupling capacitors 99, 100 for amplification. A portion of the signal current passed via the capacitor 110 is rectified by the diode 118, its output being smoothed in the long time-constant circuit (comprising by the resistor 116 and capacitor 117) thereby providing a slowly-varying control signal which follows the peak input audio signals. This control signal is applied to the base of the transistor comprising the variable impedance circuit 114, resulting in the D.C. current levels in the respective transistors 79, 80 and their respective associated voice coils 46, 48 to change upwardly and downwardly as the peaks of the signals sought to be amplified vary upwardly and downwardly, respectively. As a result, high D.C. currents flow in the power transistors 79, 80 and the voice coils 46, 48 only when needed to avoid clipping, the transistors 79, 80 virtually being off when no signal is to be amplified. However, when the switch 115 is in its alternate position (or upper position as shown in FIG. 4), the D.C. current levels would not be changed automatically, but would be determined by the setting of the second potentiometer 128 which changes as a result of changes in the setting of the first volume-control potentiometer 129 to which it is ganged.

It is to be understood that while two air gaps are shown in FIGS. 1–3 with the voice coils being in respective gaps, the present invention can be practiced with the respective voice coils in the same air gap, it only being necessary to wind the coils in such a direction with respect to the D.C. current that the D.C. produced magnetic forces cancel, while the A.C. produced forces add.

It is also possible to modify the circuit so that the signal current is fed to the base of the transistor constituting the variable impedance 114, the circuit in effect then operating as an expander.

It is to be understood that the foregoing discussion and accompanying illustrations have been set out by way of example and not by way of limitation. Numerous other embodiments and variants are possible within the spirit and scope of the present invention without departing therefrom, its scope being defined by the appended claims.

What is claimed is:

1. A loudspeaker system comprising, in combination, at least one electromagnetic loudspeaker assembly consisting of a single vibratory coil form to which a vibratory diaphragm is attached, at least two voice coils wound on said vibratory coil form, each operating within a magnetic field, a signal conditioning network and at least one pair of amplifiers, one for each of said voice coils, means coupling said signal conditioning network to each of said amplifiers, means coupling said amplifiers to respective ones of said voice coils, means for providing D.C. currents to said voice coils to develop magnetic forces about each of said voice coils such that these forces are caused to oppose one another, means for providing audio signal currents to said voice coils from said amplifiers in such phase relation that magnetic forces which are additive are developed about said voice coils to produce a vibratory motion of said voice coil form and said diaphragm attached thereto in response to audio signals from said amplifiers, a power supply, means connected between said power supply and said voice coils for adjusting the D.C. current levels supplied to the voice coils, and means for controlling said means connected between said power supply and said voice coils to change the level of D.C. current in said voice coils to assure that the audio signals will not be clipped.

2. A loudspeaker assembly according to claim 1, wherein said pair of amplifiers are Class A amplifiers.

3. A loudspeaker assembly according to claim 1, wherein said means connected between said power supply and said voice coils comprises a variable impedance circuit.

4. A loudspeaker assembly according to claim 1, wherein said means for controlling comprises means responsive to the audio signal input level for developing a D.C. control signal having a slowly varying magnitude representing peak levels of the audio signal, said means connected between said power supply and said voice coils being responsive to said D.C. control signal.

5. A loudspeaker assembly according to claim 1, further including volume control means, and wherein said means for controlling comprises means responsive to setting of said volume control means for developing a D.C. control signal having a varying magnitude depending on said setting of said volume control, said means connected between said power supply and said voice coils being responsive to said D.C. control signal.

6. A loudspeaker assembly according to claim 1, further including a high-pass audio filter, said high pass audio filter being connected to the signal input of said signal conditioning circuit.

7. A loudspeaker assembly according to claim 1, further including a filter passing high and mid frequency audio signals, said filter being connected to the signal input of said signal conditioning circuit.

8. In a loudspeaker system having a pair of voice coils carried by a vibratory coil form, the combination of a pair of amplifiers, one for each of the coils, a signal conditioning circuit means, means coupling input audio signals to the signal conditioning circuit means, whereby amplified output signals are produced which are 180 degrees out of phase with one another, means coupling the output signals to the amplifiers, respectively, means responsive to a portion of the input audio signals for providing a slowly-varying control signal which follows the peaks of the input audio signals, a D.C. power supply means, a variable impedance circuit means connected between the power supply means and the respective amplifiers, and means for applying the control signal to the variable impedance circuit means, whereby the D.C. current levels in the respective amplifiers and hence in the respective coils vary upwardly and downwardly as the peaks of the input audio signals vary upwardly and downwardly, respectively, thereby assuring that the audio signals will not be clipped.

9. In a loudspeaker system having a pair of voice coils carried by a vibratory coil form, the combination of a pair of amplifiers, one for each of the coils, a signal conditioning circuit means, means including a first volume-control potentiometer for coupling input audio signals to the signal conditioning circuit means, whereby amplified output signals are produced which are 180 degrees out of phase with one another, means coupling the output signals to the amplifiers, respectively, a D.C. power supply means, a variable impedance circuit means connected between the power supply means and the respective amplifiers, a second potentiometer having a wiper ganged to the first volume-control potentiometer, and means connecting the second potentiometer to the variable impedance circuit means, whereby the D.C. current levels in the respective amplifiers and hence in the respective coils are determined by the setting of the first volume-control potentiometer.

10. In a loudspeaker system having a pair of voice coils carried by a vibratory coil form, the combination of a pair of amplifiers, one for each of the coils, a signal conditioning circuit means, means including a first-volume control potentiometer for coupling input audio signals to the signal conditioning circuit means, whereby amplified output signals are produced which are 180 degrees out of phase with one another, means coupling the output signals to the amplifiers, respectively, means responsive to a portion of the input audio signals for providing a slowly-varying control signal which follows the peaks of the input audio signals, a D.C. power supply means, a variable impedance circuit means connected between the power supply means and the respective amplifiers, a second potentiometer having a wiper ganged to the first volume-control potentiometer, a switch means having first and second selectable positions, means operative in the first position of the switch means for applying the control signal to the variable impedance circuit means, whereby the D.C. current levels in the respective amplifiers and hence in the respective coils vary upwardly and downwardly as the peaks of the input audio signals vary upwardly and downwardly, respectively, thereby assuring that the audio signals will not be clipped, and means operative in the second position of the switch means for connecting the wiper of the second potentiometer to the variable impedance circuit means, whereby the D.C. current levels in the respective amplifiers and hence in the respective coils are determined by the setting of the first volume-control potentiometer.

11. The combination of claim 10, further including filter means between the input audio signals and the first volume-control potentiometer.

* * * * *